United States Patent [19]

Zechman

[11] 3,774,079

[45] Nov. 20, 1973

[54] MONOLITHICALLY FABRICATED TRANISTOR CIRCUIT WITH MULTILAYER CONDUCTIVE PATTERNS

[75] Inventor: John H. Zechman, Endicott, N.Y.

[73] Assignee: International Business Machines Corporation, Armonk, N.Y.

[22] Filed: June 25, 1971

[21] Appl. No.: 156,729

[52] U.S. Cl. ............ 317/101 A, 317/234 R, 204/15
[51] Int. Cl. ............................................ H01l 11/00
[58] Field of Search .......... 317/101, 235 R, 235 AJ, 317/235 AK, 101 A, 234 R; 204/15

[56] References Cited

UNITED STATES PATENTS

| | | | |
|---|---|---|---|
| 3,634,203 | 1/1972 | McMahon et al. | 204/15 |
| 3,586,922 | 7/1972 | Johnson et al. | 317/101 A UX |
| 3,240,685 | 3/1966 | Maissel | 204/15 |
| 3,577,036 | 5/1971 | Curtis et al. | 317/101 A |
| 3,615,949 | 10/1971 | Hicks | 317/101 A X |

*Primary Examiner*—J. R. Scott
*Attorney*—John C. Black et al.

[57] ABSTRACT

During the processing of monolithically fabricated semiconductor circuits, the entire surface of a chip or wafer is covered completely with aluminum or another suitable conductive pattern material. The surface of the wafer is then selectively masked for the purpose of isolating conductive patterns from each other. Instead of the usual process of removing unwanted portions of the aluminum surface, the aluminum is anodized in an electrolytic bath to change the unmasked portions of the aluminum pattern to aluminum oxide. In this way, the conductive patterns are isolated from each other by the aluminum oxide rather than by removal of aluminum and covering of the surface with sputtered quartz. By repeating the steps of evaporating a layer of aluminum over the wafer and then selectively masking and anodizing the unmasked areas, a multilayer interconnection pattern can be formed without the requirement of sputtered quartz between the various layers. With this method, metal conductor crossovers are easily produced thereby obviating the need for crossunders within the semiconductor material. It has been found that the aluminum oxide formed by anodization within the electrolytic bath is not subject to some of the pin hole problems that exist with respect to the sputtered quartz thereby eliminating part of the problems that has existed to inhibit the widespread introduction of multilayer conductive patterns in the integrated circuit art. A problem, which has existed with multilayer conductive patterns is also obviated by the improved method, i.e. the ability to make reliable electrical connections between the aluminum (or other conductor) of two different interconnection layers, has been extremely difficult or costly with known earlier techniques.

14 Claims, 16 Drawing Figures

MONOLITHICALLY FABRICATED TRANISTOR CIRCUIT WITH MULTILAYER CONDUCTIVE PATTERNS

BACKGROUND OF THE INVENTION

1. Field of the Invention

Recent trends in the semiconductor art, particularly that which is concerned with data processing apparatus, is in the direction of miniaturization of the semiconductor device structures to achieve higher operating speeds, lower cost of fabrication, and greater component reliability. A large number of active and passive devices are fabricated in a single semiconductor chip, i.e. a single substrate of a monocrystalline material of a given conductivity type.

One of the more difficult problems in the fabrication of such devices has been the formation of electrical interconnections between active and passive devices and input-output terminals. For various technological and cost reasons, it has been economically feasible in most instances to produce integrated semiconductor devices with only a single layer of interconnection metal. An important feature of the present application is an improved method and means for making electrical interconnections between two or more separate levels of metalization patterns.

2. Description of the Prior Art

U.S. Pat. No. 3,557,444, issued Jan. 26, 1971, to C. E. Ruoff, and entitled "Monolithic Bipolar Transistor Logic Circuit and Method of Forming Same," proposes one solution to the interconnection problem for a particular type of digital logic circuitry making use of the circuit impedances and other underpass means for producing certain of the electrical interconnections.

U.S. Pat. No. 3,577,036, issued May 4, 1971, to J. J. Curtis and C. E. Ruoff, and entitled "Method and Means for Interconnecting Conductors on Different Metalization Pattern Levels on Monolithically Fabricated Integrated Circuit Chips by Alloying an Interconnection Portion of Each Conductor to Contiguous Portions of One Low Resistivity Region of the Chip," suggests another solution to the interconnection problem between two metallic levels by joining them to contiguous portions of an isolated low resistivity region within the semiconductor chip. As described more fully in the latter patent, one major obstacle to extremely high performance (high speed) logical circuitry on a large scale integrated semiconductor chip is the finding of a suitable means for making interconnections between the two levels in a small area. Crossunder diffusions are not satisfactory because they slow down the speed of the logic circuitry.

Metallic interconnections prior to the latter patent were unsatisfactory because the contacts required too large a surface area and proved unreliable under constant usage.

SUMMARY OF THE INVENTION

It is an object of the present invention to provide an improved method and means for interconnecting two or more levels of metalization patterns with the active and passive devices of large scale integrated semiconductor chips.

Another object is the provision of a more simplified and improved method and means for producing metalization patterns and isolating them from each other.

The improvement of the present application is applicable to both bipolar and field effect transistor arts and is not dependent upon the type of processing used to form the circuitry within the semiconductor chip.

The improvement of the present application involves the conventional fabrication of electronic circuits within the chips of a semiconductor wafer and the subsequent growth upon the upper surface of the wafer of a layer of silicon dioxide to protect the upper surface of the chip and to isolate the active and passive devices on the chip from each other as well as from the circuit patterns to be deposited above the layer of silicon dioxide. The layer of silicon dioxide is then selectively masked in a conventional manner to permit the etching away of the silicon dioxide from all surface regions overlying the contact regions within the semiconductor chip. After the contact regions within the semiconductor chip are exposed and cleaned by conventional techniques, the wafer is coated with aluminum (or other suitable conductive material) preferably by metal vacuum evaporation techniques. A suitable photoresist is applied to the aluminum surface, and the wafer is spun to obtain the desired photoresist thickness. In the preferred embodiment, a photoresist pattern is defined on the surface of the aluminum through the use of a conventional photographic mask, ultraviolet light exposure and solvent developing techniques. The mask defined by the photoresist pattern over the aluminum defines the desired aluminum pattern. The wafer is then connected to the positive terminal of a d.c. power supply by way of a clip or holder. The negative terminal is connected to a platinum electrode, and the wafer and negative electrode are submerged in a room temperature solution of 100 milliliters of sulfuric acid ($H2SO4$) and 300 milliliters of de-ionized water (DI $H2O$).

In one successful embodiment, the power supply is regulated for a current of 75 milliamperes. When the current reduces to 50 milliamperes, the wafers are removed, rinsed in DI $H2O$, inspected, resist stripped. Devices made in this fashion were tested; and the electrical characteristics of the devices appeared to be very good, showing excellent isolation and clean characteristics. Conductive patterns, one-tenth of a milli-inch wide with spaces of aluminum oxide of one-tenth milli-inch width, were produced satisfactorily by this procedure. In one embodiment, a small temperature differential is maintained with the cooler part of the bath being at the wafer and clip contact point. This has been found to enhance the process. A reverse temperature profile will prematurely cut off the anodizing process at the clip thereby prohibiting complete anodization of the wafer.

In order to produce additional layers of conductive patterns, the process steps are repeated. That is, the upper surface of the water formed as described above is cleaned by a d.c. reverse sputtering process in a vacuum chamber to remove surface contamination. A second layer of aluminum is then deposited on the upper surface. A photoresist mask is formed, and the exposed aluminum is anodized. The photoresist is then removed.

Interconnections between the various layers of interconnected patterns are provided by metal crossovers formed by the selective masking process. Where connections are desired, the adjacent layers of aluminum interconnect directly with each other; and where isolation is desired, aluminum oxide is formed between adjacent conductive patterns. Aluminum crossovers are formed by three sequences of steps being executed to provide the three levels of conductive patterns. A lower level conductive pattern is enclosed by aluminum oxide of the lower level on either side thereof and by aluminum oxide in the second level overlying it. On either side of the aluminum oxide of the second layer overlying the lower level pattern are one or more transverse patterns of aluminum which are physically and electrically connected to one or more conductive patterns in the third level which overlie and abut the aluminum patterns and the aluminum oxide of the second level.

The replacing of the known etching operation by an anodizing operation changes the electrical characteristics of the anodized areas from a conductor to an insulator. This can be expected to provide a less failure-prone system since the space between etched conductive lines is filled with insulating material which was initially integral with the line material.

BRIEF DESCRIPTION OF THE DRAWINGS

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
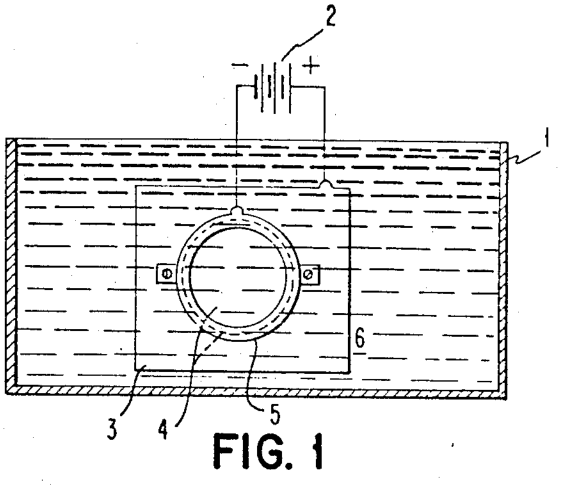
FIG. 1 diagrammatically illustrates the anodizing process equipment.

FIG. 1 diagrammatically illustrates apparatus for performing the electrolytic anodizing of a wafer 4. In FIG. 1, there is shown a beaker or other container 1 filled with a solution 6 comprising 100 milliliters of sulfuric acid to 300 milliliters of deionized water. The liquid may be maintained at room temperature. The positive terminal of a battery 2 is connected in the preferred embodiment to an electrode 3 preferably of an inert metal such as platinum. The negative terminal of the battery 2 is connected to the wafer 4 preferably by way of a ring type clip or holder 5 spaced from and parallel with the electrode 3.

The reason for providing a circular or annular clip such as 5 is to provide a large contact surface area between the wafer 4 and the negative battery connection. This will assure the flow of adequate current through the circuit to complete anodizing of the surface of the wafer 4 to a suitable degree prior to excessive anodization of the contact area between the wafer 4 and the clip 5.

A simple alligator clip can be used to connect the negative terminal of the battery 2 to the wafer 4. However, in this instance, the alligator clip must be placed in a position relative to the remainder of the surface of the water 4 to be anodized so that the electrolytic fluid temperature at the alligator clip is cooler than the temperatur of the liquid at the wafer surface to be selectively anodized. This prevents excessive early anodization at the point of contact between the wafer 4 and the clip 5, which excessive anodization prematurely reduces the current level significantly and prevents complete anodization of the wafer surface. To maintain such a temperature differential, it is adequate merely to have the alligator clip at the top of the wafer and to include a heating source (not shown) below the beaker 1. The difference in temperature at different liquid levels is adequate to assure complete anodization.

Figure 2A:
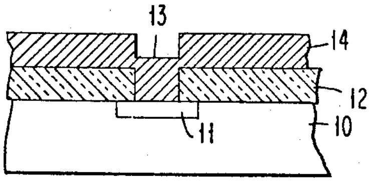
FIGS. 2*a*–2*g* inclusive are a flow diagram illustrating various steps in cross section of the fabrication process for one portion of the embodiment of the improved multilayer conductive pattern structure.

One embodiment of the invention will now be described in detail with respect to FIGS. 2*a*–2*g* inclusive. In FIG. 2*a*, there is shown a fragmented portion of a silicon chip which may be any one of several well known types with active and/or passive components (not shown) formed in the upper surface thereof. The chip 10 is typically one of a large plurality of chips within a wafer; the components being formed on all chips during processing of the wafer. These components may include either bipolar or field effect transistors or both. Each active and passive device includes two or more contact regions such as region 11 illustrated in FIG. 2*a*.

After all of the active and passive devices have been formed within the chip 10, a layer of silicon dioxide 12 is grown over the upper surface of the chip in a conventional manner. The wafer is then selectively masked, and the unmasked portions of the silicon dioxide are etched away as shown at 13 in FIG. 2*a* to permit the formation of electrical connections to the contact regions 11.

Figure 2B:
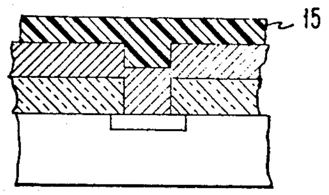
Figure 2C:
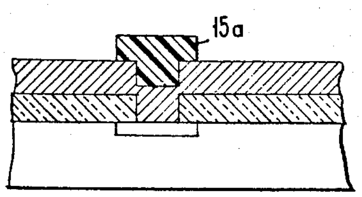
Figure 2D:
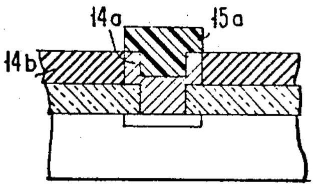

The wafer is then coated with aluminum 14 preferably by metal vacuum evaporation techniques. As seen in FIGS. 2*b* and 2*c*, a suitable photoresist layer 15 is applied to the wafer, and the wafer is spun to obtain the desired resist thickness. The photoresist pattern 15*a* is then defined through the use of a photographic mask, ultraviolet light exposure and solvent developing techniques. The wafer is then attached to the clip 5 and suitable connections are made to the battery and the platinum electrode 3 as illustrated in FIG. 1. The aluminum surface 14*b* which is not covered by the photoresist is anodized (FIG. 2*d*) isolating a plurality of conductive patterns 14*a* from each other. Although many different current levels and procedures may be used, it has been found that one suitable procedure is to regulate the power supply 2 for an initial current flow of 75 milliamperes. Anodization is performed until the current level falls off to approximately 50 milliamperes. The wafers are removed, rinsed in deionized water and resist stripped. Devices formed in this manner have been found to show excellent isolation and clean characteristics.

Figure 2E:
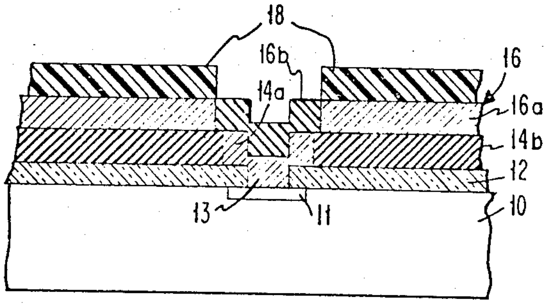

As illustrated in FIG. 2*e*, the wafer is again coated with aluminum 16 and photoresist 18, and the wafer is spun to obtain the desired resist thickness. By use of photographic techniques, a selected resist pattern is defined for the second level of aluminum. Then the wafer is again subjected to anodization as shown in FIG. 1 to form a second layer of aluminum conductive patterns 16 isolated by anodized aluminum oxide 16*b* and 14*b*. Subsequent to the anodization, the wafer is removed, rinsed in de-ionized water and resist stripped.

Figure 2F:
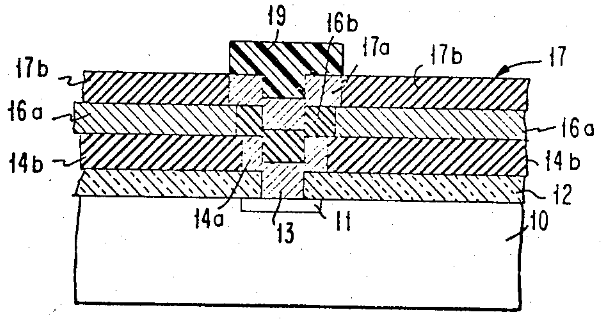

A third layer of aluminum 17 is formed on the wafer by metal vacuum evaporation (FIG. 2*f*). A suitable photoresist 19 is applied, and the wafer spun to obtain the desired thickness. The desired photoresist pattern is then formed using a photographic mask, an ultraviolet light source for exposure and subsequent solvent developing of the pattern.

The wafer is again subjected to an anodization process as illustrated in FIG. 1 to produce a third layer of conductive aluminum patterns 17*a* electrically isolated from each other by the anodized aluminum oxide 17*b* as illustrated in FIG. 2*f*.

The patterns 16*a* and 17*a* form one example of a conductive "overpass" across the transversely positioned pattern 14*a* and electrically isolated from pattern 14*a* by areas 14*b* and 16*b*.

Figure 2G:
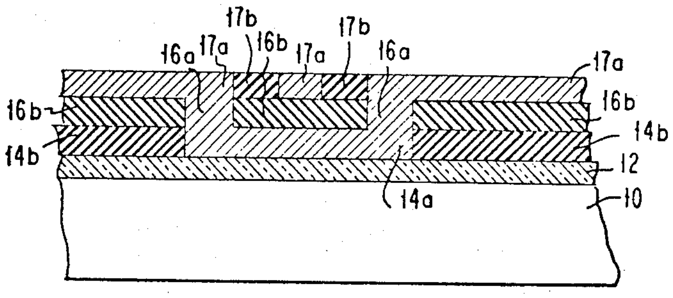

FIG. 2*g* illustrates another portion of the same chip 10 illustrated in FIGS. 2*a*–2*f* inclusive at a point where no contact region (such as 11) appears. FIG. 2*g* is intended to illustrate one form of an electrical "underpass" between certain of the conductive patterns 17*a* of the upper level and 14*a* of the lower level by way of the conductive pattern 16*a* of the intermediate level. An additional conductive pattern portion 17*a* is illustrated in FIG. 2*g* as being transverse to the right and left portions of the pattern 17*a* and isolated therefrom by anodized areas 17*b* on either side thereof.

Other forms of underpass and overpass connections can be made.

It will be appreciated that additional levels (not shown) of metalization can be provided if required.

Figure 3A:
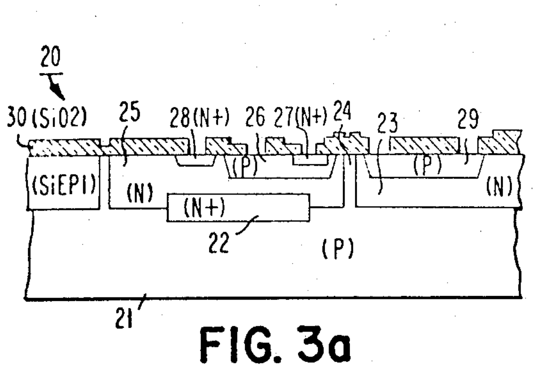
FIGS. 3*a*–3*f* inclusive are a flow diagram illustrating various steps in cross section of the fabrication process for another portion of the embodiment of the improved structure, and FIG. 4 diagrammatically illustrates one semiconductor chip having a plurality of circuits formed thereon and interconnected by the improved method and means of the present application.

One important advantage of the improved method and means over prior art techniques of etching away the aluminum between the conductive patterns is the minimizing of the thickness of the layers and avoiding "hills and valleys" on the surface. These "hills" are caused by the difference in height between the etched away surfaces and the conductive patterns for each level. Each application of metal and insulating sputtered quartz (between layers in the prior art) must be thicker than the maximum hill to valley measurement. With applicant's aluminum, aluminum oxide of nearly equal height per layer, the layer thickness and irregularity are minimized. FIGS. 3*a*–3*g* illustrate an application of the improved process for producing multilayer conductive patterns applied to the bipolar transistor logic technology illustrated in the above Ruoff patent. Thus, FIG. 3*a* illustrates a portion of a semiconductor chip 20 having a substrate 21 comprised of a monocrystalline silicon structure fabricated by conventional techniques. After suitable masking of the upper surface of the substrate 21, a diffusion operation is carried out to form a N+ region 22 in the upper surface of the substrate to act as a buried sub-collector for a transistor to be described presently. An epitaxial layer 23 is grown on the upper surface of the substrate 21. A P+ diffusion 24 is carried out to define a transistor collector area 25 in the epitaxial layer 23. The base, emitter and collector contact areas 26, 27 and 28 are then formed in a conventional manner.

A resistor region 29 is formed in the epitaxial layer 23 simultaneous with the formation of the base area 26. When all active and passive device regions have been formed as shown in FIG. 3*a*, a final isolating layer of silicon dioxide 30 is grown over the upper surface of the chip 20. The isolating layer 30 is suitably masked for subsequent etching of holes therethrough to permit the making of electrical contact with the various active and passive device contact regions as seen in FIG. 3*a*.

Figure 3E:
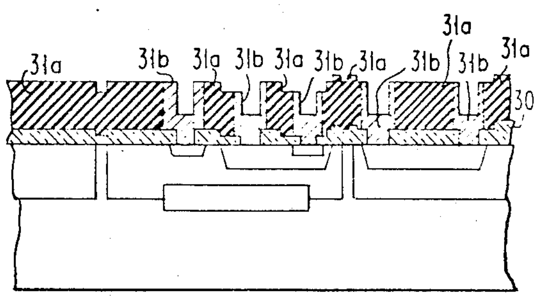
Figure 3B:
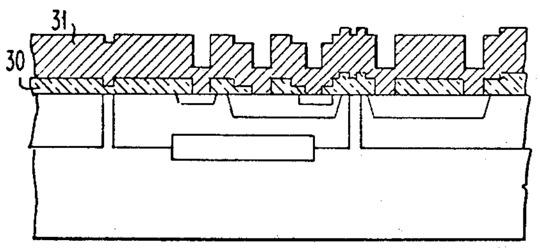

A layer of aluminum 31 is deposited on the upper surface of the silicon dioxide 30 (FIG. 3*b*) and makes engagement and electrical contact with the active and passive device contact regions. A photoresist mask 32 (FIG. 3*c*) is formed as described above with respect to FIGS. 2*a*–2*g*. In FIG. 3*d*, the unprotected portions 31*a* of the aluminum layer are anodized leaving conductive patterns 31*b* isolated from each other and making suitable electrical contact to the active and passive device contact regions. The photoresist pattern is then removed (FIG. 3*e*). Before each level of aluminum is applied to the surface, it is preferable to remove all surface contamination by a conventional d.c. reverse sputtering process in a vacuum chamber.

Figure 3F:
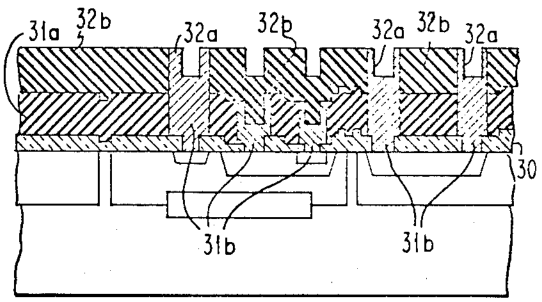
Figure 3C:
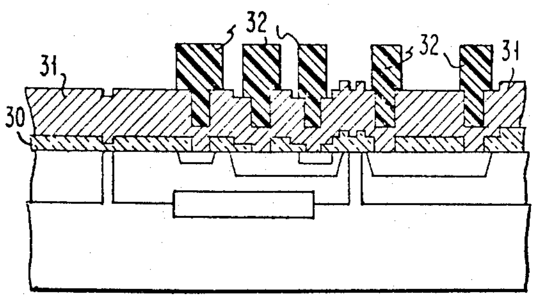
Figure 3G:
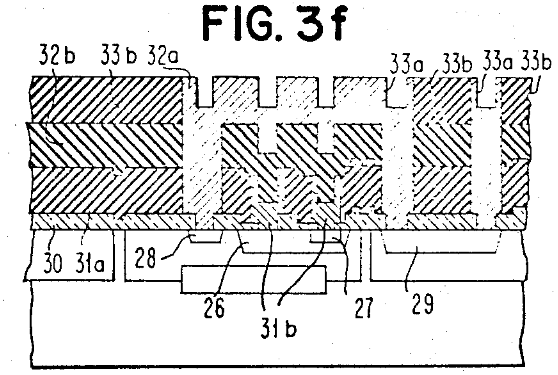
Figure 3D:
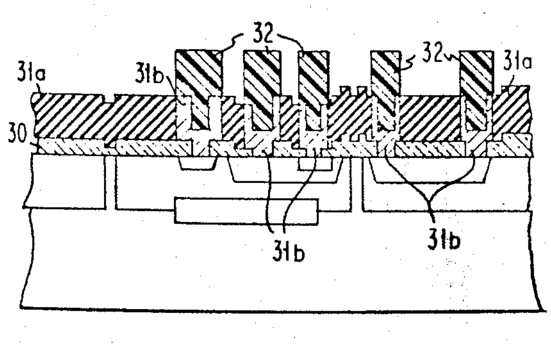

FIG. 3*f* illustrates a second metalization pattern 32*a* formed above and making contact with certain of the patterns 31*b* of FIG. 3*d*. The patterns 32*a* of FIG. 3*f* are isolated from each other in the second level by aluminum oxide areas 32*b*. The central portion of the aluminum oxide area 32*b* in FIG. 3*f* is illustrated as electrically isolating two of the conductive patterns 31*b* from all other patterns in the immediate vicinity of the cross section.

FIG. 3*g* illustrates a third level of metalization including conductive patterns 33*a* isolated from each other by aluminum oxide areas 33*b*. FIG. 3*g* illustrates an "overpass" for electrically connecting the collector contact area 28 with one terminal or contact area of the resistor 29 by way of aluminum metalization patterns 31*b*, 32*a* and 33*a*. This "overpass" is electrically isolated from the emitter and base connections 27 and 26 and their electrical contacts to patterns 31*b* by means of the center-most aluminum oxide area 32*b*.

Figure 4:
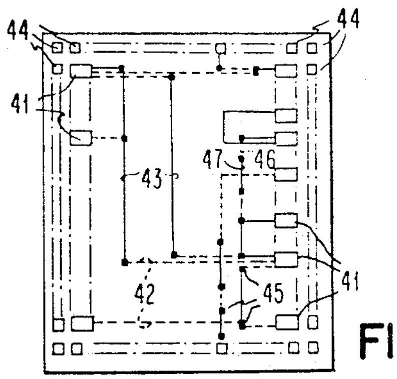

FIG. 4 is a representation of a semiconductor circuit chip 40 having a plurality of active and passive devices 41 interconnected by conductive patterns 42 which appear in a first level of metalization and patterns 43 which appear in an upper or third level of metalization of the type illustrated in FIGS. 2*a*–2*g* (or FIGS. 3*a*–3*f*) inclusive. Electrical connection from the circuits on the chip 40 to external circuits is by way of input-output terminals 44. The interconnections between the conductive patterns 42 of the first level and patterns 43 of the third level is by way of conductive patterns of the econd level as illustrated at 45. The metalization patterns of FIG. 4 follow one of the more common conventions used by industry, that is, arranging a first set parallel conductive patterns on a first layer and a second set of parallel conductive patterns transverse thereto on a different layer electrically isolated from the first. Each intersection between a line on one layer and a line on another layer requires the use of either an "overpass" (FIG. 2*f*) or an "underpass" (FIG. 2*g*). Examples of typical underpasses and overpasses are illustrated at 46 and 47.

It will be appreciated that a preferred embodiment of the improved method and means has been discussed with respect to electrical circuits of the bipolar (or FET) semiconductor type. However, it will be appreciated that the improved method and means can be used to form electrical interconnections between components of any circuit technology, and on cards or boards as well as on semiconductor chips.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In a structure of the type in which semiconductor circuit components are formed in one face of the substrate of a single semiconductor chip by a monolithic fabrication technique, an electrical interconnection means for said components comprising metalization patterns formed in each of at least three layers one above the other on said face of said chip, each layer of metalization patterns including a single metallic layer, having electrolytically anodized portions to electrically isolate other conductive portions thereof from each other, at least certain of said conducting portions in an intermediate one of said layers electrically and physically connected to selected conductive portions in both of a pair of layers above and below said intermediate layer to selectively interconnect said patterns in a predetermined manner, certain of said patterns being electrically and physically connected to said components, a first conductive pattern in one layer of said pair, a second conductive pattern in the other layer of said pair and aligned in juxtaposed relation with said first conductive pattern, and means including an additional pair of conductive patterns in said intermediate layer, each physically and electrically connected to said second conductive pattern and electrically isolated from said first conductive pattern, to form an electrical bypass around said first conductive pattern.

2. The structure set forth in claim 1, wherein the patterns in the layer immediately adjacent said one face form the physical and electrical connections to all of said components, and wherein the patterns in the layer furthest from said one face form all of the electrical connections to circuits external to the chip.

3. The structure set forth in claim 2 further comprising an insulation layer interposed between said one face of said substrate and said layer of metalization patterns immediately adjacent said one face, and apertures formed in said insulation layer filled with portions of the last-mentioned metalization patterns for making said electrical connections to said circuit components.

4. The structure set forth in claim 1 wherein said second and additional conductive patterns form an overpass around said first conductive patterns.

5. The structure set forth in claim 1 wherein said second and additional conductive patterns form an underpass around said first conductive patterns.

6. The structure set forth in claim 1 wherein the last-mentioned means further comprises a further pair of conductive patterns in said one layer of said pair electrically isolated from said first conductive pattern and each further pattern being physically and electrically connected to a respective one of said additional pair of conductive patterns.

7. In a structure of the type in which semiconductor circuit components are formed in one face of the substrate of a single semiconductor chip by a monolithic fabrication technique, an electrical interconnection means for said components comprising metalization patterns formed in each of at least three layers one above the other on said face of said chip, each layer of metalization patterns including a single metallic layer, having electrolytically anodized portions to electrically isolate other conductive portions thereof from each other, at least certain of said conducting portions in an intermediate one of said layers electrically and physically connected to selected conductive portions in both of a pair of layers above and below said intermediate layer to selectively interconnect said patterns in a predetermined manner, certain of said patterns being electrically and physically connected to said components, first elongated parallel conductive patterns in one layer of said pair, second elongated parallel conductive patterns in the other layer of said pair, conductive patterns in said intermediate layer selectively interconnecting patterns in said one and other layers, means including respective ones of said first patterns and additional pairs of conductive patterns in said intermediate layer, each latter pair physically and electrically connected to one of said first patterns and electrically isolated from a selected second pattern, to form electrical bypasses around said selected second patterns, and means including respective ones of said second patterns and additional pairs of conductive patterns in said intermediate layer, each latter pair physically and electrically connected to one of said second patterns and electrically isolated from a selected first pattern, to form electrical bypasses around said selected first patterns.

8. In a structure of the type in which semiconductor circuit components are formed in one face of the substrate of a single semiconductor chip, an electrical interconnection means for said components, comprising metalization patterns formed in each of at least three layers one above the other on said face of said chip, each layer of metalization patterns including a single metallic layer, having electrolytically anodized portions to electrically isolate ther conductive portions thereof from each other, conducting portions in an intermediate one of said layers electrically and physically connected to selected conductive portions in a pair of layers above and below said intermediate layer to selectively interconnect said patterns in a predetermined manner, certain of said patterns being electrically and physically connected to said components, the patterns in the layer immediately adjacent said one face forming the physical and electrical connections to all of said components, and the patterns in the layer furthest from said one face forming all of the electrical connections to circuits external to said chip.

9. The structure set forth in claim 8 further comprising a first conductive pattern in one layer of said pair, as second conductive pattern in the other layer of said pair and aligned in juxtaposed relation with said first conductive pattern, and means including an additional pair of conductive patterns in said intermediate layer, each physically and electrically connected to said second conductive pattern and electrically isolated from said first conductive pattern, to form an electrical bypass around said first conductive pattern.

10. The structure set forth in claim 9 wherein the last-mentioned means further comprises a further pair of conductive patterns in said one layer of said pair electrically isolated from said first conductive pattern and each further pattern being physically and electrically connected to a respective one of said additional pair of conductive patterns.

11. In a structure of the type in which semiconductor circuit components are formed in one face of the substrate of a single semiconductor chip, an electrical interconnection means for said components, comprising metalization patterns formed in each of at least three layers one above the other on said face of said chip, each layer of metalization patterns including a single metallic layer, having electrolytically anodized portions to electrically isolate other conductive portions thereof from each other, conducting portions in an intermediate one of said layers electrically and physically connected to selected conductive portions in a pair of layers above and below said intermediate layer to selectively interconnect said patterns in a predetermined manner, certain of said patterns being electrically and physically connected to said components, first elongated parallel conductive patterns in one layer of said pair, second elongated parallel conductive patterns in the other layer of said pair, conductive patterns in said intermediate layer selectively interconnecting patterns in said one and other layers, means including respective ones of said first patterns and additional pairs of conductive patterns in said intermediate layer, each latter pair physically and electrically connected to one of said first patterns and electrically isolated from a selected second pattern, to form electrical bypasses around said selected second patterns, and means including respective ones of said second patterns and additional pairs of conductive patterns in said intermediate layer, each latter pair physically and electrically connected to one of said second patterns and electrically isolated from a selected first pattern, to form electrical bypasses around said selected first patterns.

12. In a structure of the type in which circuit components are carried by a mounting element, an electrical interconnection means on said element for said components, comprising metalization patterns formed in each of at least three layers one above the other on one face of said element, each layer of metalization patterns including a single metallic layer, having electrolytically anodized portions to electrically isolate other conductive portions thereof from each other, conducting portions in an intermediate one of said layers electrically and physically connected to selected conductive portions in a pair of layers above and below said intermediate layer to selectively interconnect said patterns in a predetermined manner, said metalization patterns in at least one of said layers electrically connected to said components, a first conductive pattern in one layer of said pair, a second conductive pattern in the other layer of said pair and aligned in juxtaposed relation with said first conductive pattern, and means including an additional pair of conductive patterns in said intermediate layer, each physically and electrically connected to said second conductive pattern and electrically isolated from said first conductive pattern, to form an electrical bypass around said first conductive pattern.

13. The structure set forth in claim 12 wherein the last-mentioned means further comprises a further pair of conductive patterns in said one layer of said pair electrically isolated from said first conductive pattern and each further pattern being physically and electrically connected to a respective one of said additional pair of conductive patterns.

14. In a structure of the type in which circuit components are carried by a mounting element, an electrical interconnection means on said element for said components, comprising metalization patterns formed in each of at least three layers one above the other on one face of said element, each layer of metalization patterns including a single metallic layer, having electrolytically anodized portions to electrically isolate other conductive portions thereof from each other, conducting portions in an intermediate one of said layers electrically and physically connected to selected conductive portions in a pair of layers above and below said intermediate layer to selectively interconnect said patterns in a predetermined manner, said metalization patterns in at least one of said layers electrically connected to said components, first elongated parallel conductive patterns in one layer of said pair, second elongated parallel conductive patterns in the other layer of said pair, conductive patterns in said intermediate layer selectively interconnecting patterns in said one and other layers, means including respective ones of said first patterns and additional pairs of conductive patterns in said intermediate layer, each latter pair physically and electrically connected to one of said first patterns and electrically isolated from a selected second pattern, to form electrical bypasses around said selected second patterns, and means including respective ones of said second patterns and additional pairs of conductive patterns in said intermediate layer, each latter pair physically and electrically connected to one of said second patterns and electrically isolated from a selected first pattern, to form electrical bypasses around said selected first patterns.

* * * * *